(12) United States Patent
Navarro et al.

(10) Patent No.: US 11,880,131 B2
(45) Date of Patent: Jan. 23, 2024

(54) PROCESS FOR TRANSFER IMPRINTING

(71) Applicant: Arkema France, Colombes (FR)

(72) Inventors: Christophe Navarro, Saint-Pierre d'Irube (FR); Celia Nicolet, Sauvagnon (FR); Xavier Chevalier, Grenoble (FR); Florian Delachat, Grenoble (FR); Hubert Teyssedre, Echirolles (FR)

(73) Assignee: Arkema France, Colombes (FR)

( * ) Notice: Subject to any disclaimer, the term of this patent is extended or adjusted under 35 U.S.C. 154(b) by 532 days.

(21) Appl. No.: 16/955,402

(22) PCT Filed: Dec. 19, 2018

(86) PCT No.: PCT/FR2018/053396
§ 371 (c)(1),
(2) Date: Jun. 18, 2020

(87) PCT Pub. No.: WO2019/122705
PCT Pub. Date: Jun. 27, 2019

(65) Prior Publication Data
US 2021/0072639 A1    Mar. 11, 2021

(30) Foreign Application Priority Data
Dec. 21, 2017    (FR) ..................... 17 62830

(51) Int. Cl.
| | | |
|---|---|---|
| *G03F 7/00* | (2006.01) |
| *B29C 33/62* | (2006.01) |
| *B29C 33/42* | (2006.01) |
| *C08F 112/08* | (2006.01) |
| *C08F 212/08* | (2006.01) |
| *C08F 120/26* | (2006.01) |
| *C08F 220/28* | (2006.01) |

(Continued)

(52) U.S. Cl.
CPC .......... *G03F 7/0002* (2013.01); *B29C 33/424* (2013.01); *B29C 33/62* (2013.01); *C08F 112/08* (2013.01); *C08F 120/26* (2013.01); *C08F 130/02* (2013.01); *C08F 212/08* (2013.01); *C08F 220/281* (2020.02); *C08F 230/02* (2013.01); *C08F 2438/02* (2013.01)

(58) Field of Classification Search
CPC ............................. B29C 33/62; B29C 33/424
See application file for complete search history.

(56) References Cited

U.S. PATENT DOCUMENTS 3,008,920 A * 11/1961 Urchick ................ C08F 291/18
525/70
2003/0080471 A1    5/2003 Chou
(Continued)

FOREIGN PATENT DOCUMENTS

WO    2012140383 A2    10/2012

OTHER PUBLICATIONS

International Search Report and Written Opinion for International Application No. PCT/FR2018/053396, dated May 9, 2019, 11 pages.
(Continued)

Primary Examiner — Emmanuel S Luk
(74) Attorney, Agent, or Firm — RatnerPrestia

(57) ABSTRACT

A process for transfer imprinting using a novel family of anti-sticking layers, such as for nanoimprint lithography processes, is described.

7 Claims, 2 Drawing Sheets

(51) Int. Cl.
*C08F 230/02* (2006.01)
*C08F 130/02* (2006.01)

(56) References Cited

U.S. PATENT DOCUMENTS

| | | | |
|---|---|---|---|
| 2007/0054097 A1* | 3/2007 | Suehira | B82Y 10/00 |
| | | | 428/195.1 |
| 2007/0123669 A1* | 5/2007 | Charleux | C08F 4/00 |
| | | | 526/217 |
| 2013/0084352 A1 | 4/2013 | Suzuki et al. | |
| 2014/0127418 A1 | 5/2014 | Navarro et al. | |
| 2014/0370198 A1* | 12/2014 | Navarro | C09D 153/00 |
| | | | 427/340 |
| 2015/0030971 A1* | 1/2015 | Navarro | G03F 7/0002 |
| | | | 430/5 |
| 2015/0073094 A1* | 3/2015 | Navarro | B05D 1/005 |
| | | | 525/89 |
| 2015/0079351 A1 | 3/2015 | Atasoy et al. | |
| 2016/0319158 A1* | 11/2016 | Fleury | C08F 293/005 |
| 2018/0011399 A1* | 1/2018 | Chevalier | G03F 1/72 |
| 2018/0178416 A1* | 6/2018 | Richez | G03F 7/0002 |
| 2020/0079974 A1* | 3/2020 | Qi | C09D 183/08 |

OTHER PUBLICATIONS

Zaremski et al., "A Concept for Quasiliving Nitroxide-Mediated Radical Copolymerization", Macromolecules, 2000, 33, pp. 4365-4372.

* cited by examiner

PROCESS FOR TRANSFER IMPRINTING

CROSS-REFERENCE TO RELATED APPLICATIONS

This is the national phase of International Application No. PCT/FR2018/053396, filed 19 Dec. 2018, which claims priority to French Application No. 1762830, filed 21 Dec. 2017. The disclosure of each of these applications is incorporated herein by reference in its entirety for all purposes.

FIELD OF THE INVENTION

The present invention relates to a process for transfer imprinting using a novel family of anti-sticking layers. More particularly, the present invention relates to a process for transfer imprinting using a novel family of anti-sticking layers for nanoimprint lithography processes.

The present invention also relates to the imprints obtained using this process.

Technical Problem and Prior Art

Nanoimprint lithography is a method for producing nanometer-scale models. It is a simple and low-cost nanolithography process with a high throughput and high resolution. It creates patterns by transferring existing patterns onto a template of a polymerizable or fusible formulation. The polymerizable formulation is typically a monomer and/or polymer formulation which is cured by heat or electromagnetic radiation during the imprinting process. In the case of a fusible formulation, the latter is shaped at the melting point, then cooled. The adhesion between the polymerizable (or fusible) formulation and the template (the mold) is controlled to enable correct release. In the known prior art (M. Keil et al., J. Vac. Sci. Technol. B 22(6), November/December 2004; H. Schulz et al, Proc. SPIE 3996, 244-249, 2000), this adhesion is controlled by a polymer bearing fluoro functions ensuring the anti-sticking function on the one hand, and functions that enable the grafting of this layer onto the template, generally silanes, since this anti-sticking layer absolutely must remain on the template.

Figure 1:
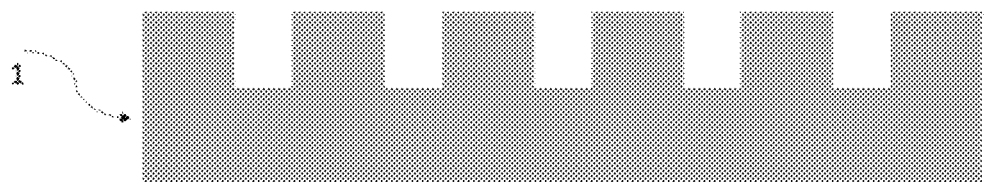
Figure 2:
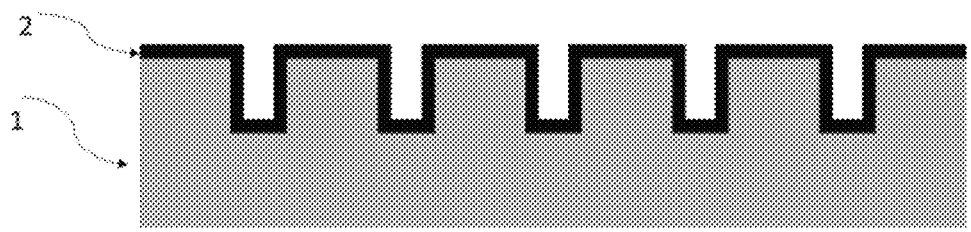
Figure 3:
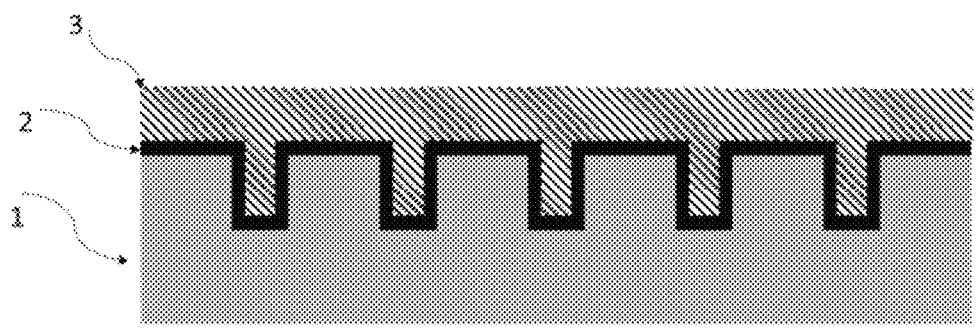
Figure 4:
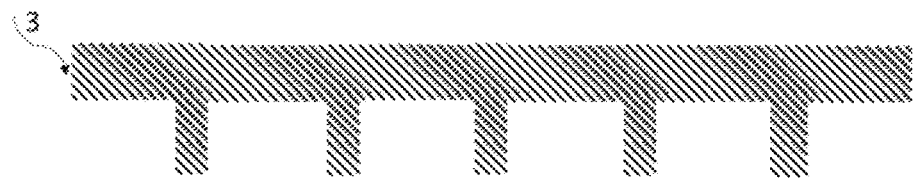

The transfer imprinting process may be summarized by the following steps:
  The template 1, FIG. 1, is formed of a material of silicon type in the case of nanoimprinting. For other transfer imprinting processes, the template may be of another nature: mineral, metal or even organic.
  The anti-sticking layer 2, FIG. 2, is formed of a material that adheres to the template but does not adhere to the imprint.
  The imprint 3, FIG. 3, is formed of a resin (polymerizable or non-polymerizable formulation) which will adopt the shape of the template covered with the anti-sticking layer.
  Once the process is finished, the imprint 3 is removed from the assembly of 1 and 2 (FIG. 4).
  Where appropriate, an adhesion primer is added between the template 1 and the anti-sticking layer 2.
  The anti-sticking layer must have at least two properties:
  It must adhere to the template with or without adhesion primer (for example activation by oxygen plasma) and it must not adhere to the imprint.

These two conditions are difficult to reconcile and elaborate chemistry is used to bring these properties together. In the case of nanoimprinting, current solutions lead to imprints that have too many replication defects to meet the requirements of electronics.

In particular, it is widely disclosed in the literature that the surface energy of the anti-sticking layer presented to the polymerizable formulation must be as low as possible in order to improve the quality of the transfer, that is to say minimize transfer defects, but also improve the lifetime of the transferred material by avoiding surface contamination (Bharat Bhushan, Springer Science & Business Media, 23 Apr. 2010, page 291). It must also be chemically inert, hydrophobic, and allow good filling of the template (ibid.), even for very shallow thicknesses (a few nanometers in the case of nanoimprint lithography processes). This teaching is also disclosed in US2013/0084352 and US2003/0080471. These two documents explicitly mention the use of hydrophobic fluoro compounds.

Adhesion to the template is generally provided by silane functions, while the properties of being anti-sticking relative to the polymerizable formulation are provided by fluoro functions (ibid.).

While WO 2012/140383 mentions a surface treatment having features similar to the process described in the present invention, nowhere does this document mention an application in the field of nanoimprinting which goes against the nanoimprinting processes and anti-sticking layers described in the prior art.

The applicant has made a surprising discovery which contradicts the commonly accepted properties relating to the anti-sticking layer.

The applicant has thus shown that the surface energy of the anti-sticking layer of the process of the invention presented to the polymerizable or non-polymerizable formulation does not have to be as low as possible, since some materials discovered by the applicant having high surface energy fulfil the function perfectly, even better. The applicant has also shown that the anti-sticking layer of the process of the invention did not need to be as hydrophobic as described, especially by the use of fluoro functions. The novel anti-sticking layer of the process of the invention discovered by the applicant does not necessarily require preparing the support by using an adhesion primer.

Finally, the quality of the imprints produced with this novel anti-sticking layer is far better, as shown by the amount of defects generated on the imprint, compared to the use of known anti-sticking layers.

The manufacture of the novel anti-sticking layer discovered by the applicant is moreover easier and more economical to produce.

SUMMARY OF THE INVENTION

The present invention relates to an anti-sticking layer used in a novel process for transfer imprinting, this anti-sticking layer comprising a homopolymer or a copolymer having at least one covalent bond that generates free radicals when the anti-sticking layer is activated thermally, by organic or inorganic redox, photochemically, by shearing, by plasma, or else under the influence of ionizing radiation, said homopolymer or copolymer having a surface energy of greater than 5 mN/m, an elastic modulus E' of greater than 1000 MPa at 25° C. and a weight-average molecular weight of greater than 500 g/mol.

DETAILED DESCRIPTION

The homopolymers or copolymers used as anti-sticking layer in the process of the invention may be obtained by any route, among which mention may be made of polycondensation, ring-opening polymerization or anionic, cationic or radical polymerization, it being possible for the latter to be controlled or uncontrolled. When the copolymers are prepared by radical polymerization or telomerization, this may be controlled by any known technique, such as NMP (Nitroxide-Mediated Polymerization), RAFT (Reversible Addition and Fragmentation Transfer), ATRP (Atom Transfer Radical Polymerization), INIFERTER (Initiator-Transfer-Termination), RITP (Reverse Iodine Transfer Polymerization) or ITP (Iodine Transfer Polymerization).

Preference will be given to polymerization processes which do not involve metals. Preferably, the copolymers are prepared by radical polymerization, and more particularly by controlled radical polymerization, even more particularly by nitroxide-mediated polymerization.

The homopolymers or copolymers used within the context of the invention may be amorphous, crystalline or semicrystalline, or else thermoset.

The homopolymers or copolymers used within the context of the invention correspond to the following general formula: R1 A R2

A is a covalent bond that generates free radicals, the bonding energy of which is between 90 and 270 kJ/mol and preferably between 100 and 170 kJ/mol at 25° C., measured according to the method described by Kerr, Chem. Rev. 66, 465-500 (1966).

Preferably, it is a carbon-oxygen bond such as is found in alkoxyamines. More particularly, the alkoxyamines derived from the stable free radical (1) are preferred:

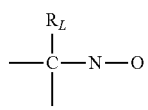

(1)

in which the radical $R_L$ has a molar mass of greater than 15.0342 g/mol. The radical $R_L$ may be a halogen atom such as chlorine, bromine or iodine, a saturated or unsaturated, linear, branched or cyclic, hydrocarbon-based group, such as an alkyl or phenyl radical, or an ester group —COOR or an alkoxyl group —OR or a phosphonate group —PO(OR)$_2$, as long as it has a molar mass greater than 15.0342. The monovalent radical $R_L$ is said to be in the β position relative to the nitrogen atom of the nitroxide radical. The remaining valences of the carbon atom and of the nitrogen atom in formula (1) can be bonded to various radicals, such as a hydrogen atom or a hydrocarbon-based radical, for instance an alkyl, aryl or arylalkyl radical, comprising from 1 to 10 carbon atoms. It is not excluded for the carbon atom and the nitrogen atom in formula (1) to be connected together via a divalent radical, so as to form a ring. Preferably, however, the remaining valences of the carbon atom and of the nitrogen atom of formula (1) are bonded to monovalent radicals. Preferably, the radical $R_L$ has a molar mass of greater than 30 g/mol. The radical $R_L$ may, for example, have a molar mass of between 40 and 450 g/mol. By way of example, the radical $R_L$ may be a radical comprising a phosphoryl group, it being possible for said radical $R_L$ to be represented by the formula (2):

(2)

in which $R^1$ and $R^2$, which may be identical or different, may be chosen from alkyl, cycloalkyl, alkoxyl, aryloxyl, aryl, aralkyloxyl, perfluoroalkyl and aralkyl radicals, and may comprise from 1 to 20 carbon atoms. $R^1$ and/or $R^2$ may also be a halogen atom such as a chlorine, bromine, fluorine or iodine atom. The radical $R_L$ may also comprise at least one aromatic ring, such as for the phenyl radical or the naphthyl radical, it being possible for said ring to be substituted, for example with an alkyl radical comprising from 1 to 4 carbon atoms.

More particularly, the alkoxyamines derived from the following stable radicals are preferred:
N-(tert-butyl)-1-phenyl-2-methylpropyl nitroxide,
N-(tert-butyl)-1-(2-naphthyl)-2-methylpropyl nitroxide,
N-(tert-butyl)-1-diethylphosphono-2,2-dimethylpropyl nitroxide,
N-(tert-butyl)-1-dibenzylphosphono-2,2-dimethylpropyl nitroxide,
N-phenyl-1-diethylphosphono-2,2-dimethylpropyl nitroxide,
N-phenyl-1-diethylphosphono-1-methylethyl nitroxide,
N-(1-phenyl-2-methylpropyl)-1-diethylphosphono-1-methylethyl nitroxide,
4-oxo-2,2,6,6-tetramethyl-1-piperidinyloxy nitroxide,
2,4,6-tri-tert-butylphenoxy nitroxide.

Aside from their bonding energy, the alkoxyamines used in controlled radical polymerization must allow good control of the linking of the monomers. Thus, they do not all allow good control of certain monomers. For example, the alkoxyamines derived from TEMPO make it possible to control only a limited number of monomers; the same is true for the alkoxyamines derived from 2,2,5-trimethyl-4-phenyl-3-azahexane-3-nitroxide (TIPNO). On the other hand, other nitroxide-based alkoxyamines corresponding to formula (1), particularly those derived from the nitroxides corresponding to formula (2) and even more particularly those derived from N-tert-butyl-1-diethylphosphono-2,2-dimethylpropyl nitroxide, make it possible to broaden to a large number of monomers the controlled radical polymerization of these monomers.

In addition, the alkoxyamine opening temperature also influences the economic factor. The use of low temperatures will be preferred in order to minimize industrial difficulties. The alkoxyamines derived from nitroxides corresponding to formula (1), particularly those derived from nitroxides corresponding to formula (2) and even more particularly those derived from N-(tert-butyl)-1-diethylphosphono-2,2-dimethylpropyl nitroxide, will therefore be preferred to those derived from TEMPO or 2,2,5-trimethyl-4-phenyl-3-azahexane-3-nitroxide (TIPNO).

R1 is a homopolymer or a copolymer and R2 is a fragment of any type: polymer, copolymer or neither. Preferably, R2 is a fragment resulting from the decomposition of controlled or uncontrolled radical polymerization initiators.

More preferentially, R1 represents homopolymers, random or block, gradient or comb copolymers, with a molecular weight measured by SEC of greater than 500 g/mol, and R2 is a molecular group with a weight of <1000 g/mol.

Gradient copolymer is intended to mean a copolymer of at least two monomers, generally obtained by living or pseudo-living polymerization. By virtue of these polymerization methods, the polymer chains grow simultaneously and therefore at each moment incorporate the same ratio of comonomers. The distribution of the comonomers in the polymer chains therefore depends on the change in the relative concentrations of the comonomers during the synthesis. Reference will be made to the following publications for a theoretical description of gradient copolymers: T. Pakula & al., Macromol. Theory Simul. 5, 987-1006 (1996); A. Aksimetiev & al. J. of Chem. Physics 111, no. 5; M. Janco J. Polym. Sci., Part A: Polym. Chem. (2000), 38(15), 2767-2778; M. Zaremski & al, Macromolecules (2000), 33(12), 4365-4372; K. Matyjaszewski & al. J. Phys. Org. Chem. (2000), 13(12), 775-786; Gray Polym. Prepr. (Am. Chem. Soc., Div. Polym. Chem.) (2001), 42(2), 337-338; K. Matyjaszewski Chem. Rev. (Washington, D.C.) (2001), 101 (9), 2921-2990.

Regarding the monomers which may be used for R1, mention may be made of:

For the precursors of polymers and copolymers by polycondensation: the monomers used for the preparation of polyamides or copolyamides, polyesters or copolyesters, polyester amides or copolyester amides, polyethers, polyimides, polyketones, polyether ketones, alone or in mixtures.

For the precursors of polymers and copolymers by anionic or cationic polymerization or by ring-opening polymerization: vinyl, vinylaromatic, vinylidene, diene, olefinic, allyl or (meth)acrylic monomers, lactones, carbonates, lactams, lactides or glycolides, oxazolines, epoxides, cyclosiloxanes, alone or in mixtures.

For the precursors of polymers and copolymers by radical polymerization: at least one vinyl, vinylidene, diene, olefinic, allyl or (meth)acrylic monomer. This monomer is more particularly chosen from vinylaromatic monomers such as styrene or substituted styrenes, especially α-methylstyrene, monofluoro, difluoro, trifluoro, tetrafluoro or pentafluoro styrenes, acrylic monomers such as acrylic acid or salts thereof, alkyl acrylates, cycloalkyl or aryl acrylates, such as methyl, ethyl, butyl, ethylhexyl or phenyl acrylate, hydroxyalkyl acrylates such as 2-hydroxyethyl acrylate, ether alkyl acrylates such as 2-methoxyethyl acrylate, alkoxy- or aryloxy-polyalkylene glycol acrylates such as methoxypolyethylene glycol acrylates, ethoxypolyethylene glycol acrylates, methoxypolypropylene glycol acrylates, methoxypolyethylene glycol-polypropylene glycol acrylates, or mixtures thereof, aminoalkyl acrylates such as 2-(dimethylamino)ethyl acrylate (DMAEA), fluoro acrylates, silyl acrylates, phosphorus acrylates such as alkylene glycol phosphate acrylates, glycidyl or dicyclopentenyloxyethyl acrylates, methacrylic monomers such as methacrylic acid or salts thereof, alkyl, cycloalkyl, alkenyl or aryl methacrylates such as methyl methacrylate (MMA), lauryl, cyclohexyl, allyl, phenyl or naphthyl methacrylate, hydroxyalkyl methacrylates such as 2-hydroxyethyl methacrylate or 2-hydroxypropyl methacrylate, ether alkyl methacrylates such as 2-ethoxyethyl methacrylate, alkoxy- or aryloxy-polyalkylene glycol methacrylates such as methoxypolyethylene glycol methacrylates, ethoxypolyethylene glycol methacrylates, methoxypolypropylene glycol methacrylates, methoxypolyethylene glycol-polypropylene glycol methacrylates, or mixtures thereof, aminoalkyl methacrylates such as 2-(dimethylamino)ethyl methacrylate (DMAEMA), fluoro methacrylates such as 2,2,2-trifluoroethyl methacrylate, silyl methacrylates such as 3-methacryloylpropyltrimethylsilane, phosphorus methacrylates such as alkylene glycol phosphate methacrylates, hydroxyethylimidazolidone methacrylate, hydroxyethylim idazolidinone methacrylate, 2-(2-oxo-1-imidazolidinyl)ethyl methacrylate, acrylonitrile, acrylamide or substituted acrylamides, 4-acryloylmorpholine, N-methylolacrylamide, methacrylamide or substituted methacrylam ides, -methylolmethacrylam ide, methacrylam idopropyltrimethylammonium chloride (MAPTAC), glycidyl methacrylates, dicyclopentenyloxyethyl methacrylates, itaconic acid, maleic acid or salts thereof, maleic anhydride, alkyl or alkoxy- or aryloxy-polyalkylene glycol maleates or hemimaleates, vinylpyridine, vinylpyrrolidinone, (alkoxy) poly(alkylene glycol) vinyl ethers or divinyl ethers, such as methoxy poly(ethylene glycol) vinyl ether, poly(ethylene glycol) divinyl ether, olefinic monomers, among which mention may be made of ethylene, butene, hexene and 1-octene, diene monomers including butadiene, isoprene, and also fluoro olefinic monomers, and vinylidene monomers, among which mention may be made of vinylidene fluoride, alone or as a mixture of at least two abovementioned monomers.

Preferably, R1 is a homopolymeric, copolymeric, oligomeric or co-oligomeric radical and R2 is a nitroxy group.

Preferably, R2 is N-(tert-butyl)-1-diethylphosphono-2,2-dimethylpropyl nitroxide.

Preferably, R1 is a random copolymer or homopolymer, the number-average molecular weight of which, measured by SEC with polystyrene standards, is between 500 and 200 000 g/mol, more preferentially between 1000 and 20 000 g/mol, and even more preferentially between 5000 and 10 000 g/mol, in order to obtain a deposit of homopolymer or copolymer according to the process of the invention of less than 50 nm, preferably less than 20 nm, even more preferably less than 10 nm and more particularly less than 5 nm. The dispersity of R1, the ratio of the weight-average molecular weights to the number-average molecular weights, is less than 5, more particularly less than 2, and preferably less than 1.5.

Preferably, R1 is formed of monomers, among which mention may be made of styrene, methyl methacrylate, glycidyl methacrylate (GMA), 2-hydroxyethyl methacrylate (HEMA), methyl or ethyl acrylate, fluoro acrylates or methacrylates, and monofluoro, difluoro, trifluoro, tetrafluoro or pentafluoro styrenes. The styrene is preferably present in the copolymer in molar amounts ranging from 40 to 100% and even more preferentially from 60 to 100%.

According to a first preferred form of the invention, the random copolymer of the invention is prepared with 2-methyl-2-[N-tert-butyl-N-(diethoxyphosphoryl-2,2-dimethylpropyl)aminoxy]propionic acid and styrene.

According to a second preferred form of the invention, the random copolymer is prepared by firstly reacting 2-methyl-2-[N-tert-butyl-N-(diethoxyphosphoryl-2,2-dimethylpropyl)aminoxy]propionic acid with a functional monomer chosen from glycidyl methacrylate (GMA) or 2-hydroxyethyl methacrylate (HEMA), and preferably glycidyl acrylate (GA) or 2-hydroxyethyl acrylate (HEA), such that a single monomer unit is added, then secondly the product of this reaction is used as initiator of one or more non-functional monomers such as an alkyl (meth)acrylate or a styrene monomer and preferably styrene alone. Thus, in this preferred form of the invention, the copolymer of the invention is the synthesis product of 2-methyl-2-[N-tert-butyl-N-(diethoxyphosphoryl-2,2-dimethylpropyl)aminoxy]propionic acid with hydroxyethyl acrylate and styrene.

Regarding the surface energy of the homopolymer or copolymer of use as anti-sticking layer in a transfer imprinting process, it is greater than 5 mN/m, preferably greater than 25 mN/m, and preferably greater than 40 mN/m, measured by the pendant drop method, with OWRK mathematical treatment.

Regarding the elastic modulus E' of the homopolymer or copolymer of use as anti-sticking layer in a transfer imprinting process, it is greater than 1000 MPa at 25° C. or at the usage temperature, measured by DMA (dynamic mechanical analysis).

In the case of amorphous polymers, it will only be possible to consider the Tg of the homopolymer or the copolymer and it will have to be greater than 25° C. or than the usage temperature, measured by DMA.

Moreover, the Flory-Huggins chi parameter between the anti-sticking copolymer or homopolymer and the resin deposited, forming the imprint, must be positive.

Regarding the transfer imprinting process using the anti-sticking layers that are a subject of the invention, it is characterized by the following steps:
    deposition of an anti-sticking layer on a template, treated or not treated beforehand by an adhesion primer (for example a surface activation plasma), this anti-sticking layer comprising a homopolymer or a copolymer having at least one covalent bond that generates free radicals when the molecule is activated thermally, by organic or inorganic redox, photochemically, by shearing, by plasma, or else under the influence of ionizing radiation, said homopolymer or copolymer having a surface energy of greater than 5 mN/m and an elastic modulus E' of greater than 1000 MPa at 25° C. or at the usage temperature,
    activation of the covalent bond that generates free radicals thermally, by organic or inorganic redox, photochemically, by shearing, by plasma, or else under the influence of ionizing radiation, in order to form a film with a thickness of less than 50 nm, preferably less than 20 nm, even more preferably less than 10 nm and more particularly less than 5 nm on the template,
    deposition or lamination of a polymer resin of a thickness ranging from 100 nm to 5 mm, whether or not deposited beforehand on a support having a Young's modulus of greater than 1 GPa,
    polymerization or cooling of the resin serving as imprint, removing the imprint.

The anti-sticking layers that are a subject of this invention can be used in any type of transfer imprinting process (creating imprints), whether this is a process of macroimprinting, microimprinting, nanoimprinting or stamping for lithography, microelectronics, photonics, optoelectronic applications (LEDs, photovoltaics), MEMS, NEMS, memories, microfluidics, biotechnology, biomedicine, self-cleaning surfaces, anti-reflective surfaces, displays (screens), transfer imprinting for replicating supports, audio or video such as CDs or DVDs, or else vinyl disks, or else more macroscopic objects such as objects for technical applications in the fields of leisure, sport, cars or aeronautics.

Preferably, the anti-sticking layer that is a subject of the invention is applied to nanoimprint lithography processes.

Depending on the type of transfer imprinting process, the nature of the template may be a semiconductor, a metal, a ceramic, an organic glass, including spin-on-glass- and spin-on-carbon-type materials.

Example 1

In this example, an anti-sticking layer according to the invention (hereinafter referred to as ASL2-invention) is prepared:

Preparation of a hydroxy-functionalized alkoxyamine (AM-OH, initiator) from the commercial alkoxyamine BlocBuilder®MA sold by Arkema The following are introduced into a 1 l round-bottomed flask purged with nitrogen:
    226.17 g of BlocBuilder® MA (1 molar equivalent)
    68.9 g of 2-hydroxyethyl acrylate (1 molar equivalent)
    548 g of isopropanol.

The reaction mixture is refluxed (80° C.) for 4 h and then the isopropanol is evaporated off under vacuum. 297 g of hydroxy-functionalized alkoxyamine (AM-OH initiator) are obtained in the form of a very viscous yellow oil.

Preparation of Functionalized Polystyrene
    260.89 g of toluene, and also 600 g of styrene and 20.89 g of the AM-OH initiator are introduced into a stainless steel reactor fitted with a mechanical stirrer and a jacket.

The reaction mixture is stirred and degassed by bubbling nitrogen at ambient temperature for 30 minutes.

The setpoint temperature of the reaction medium is then brought to 115° C. (the material temperature is 108° C.). The temperature is maintained at 115° C. throughout the polymerization until a conversion of the monomers of 50% is reached. Samples are taken at regular intervals in order to determine the polymerization kinetics by gravimetric analysis (measurement of dry extract).

When the 50% conversion is reached, the reaction medium is cooled to 60° C. and the solvent and the residual monomer are evaporated off under vacuum. After evaporation, methyl ethyl ketone is added to the reaction medium in an amount such that a solution of polymer of about 25% by mass is produced.

This polymer solution is then introduced dropwise into a beaker containing a nonsolvent (heptane), so as to cause the polymer to precipitate. The mass ratio between the solvent and nonsolvent (methyl ethyl ketone/heptane) is $1/10$ (v/v). The precipitated polymer is recovered in the form of a white powder after filtration and drying under vacuum at 40° C. for 48 h.

The characteristics of the polymer are determined by size exclusion chromatography. The polymer is dissolved at 1 g/l in BHT-stabilized THF. The calibration is performed using monodisperse polystyrene standards.
    Number-average molar mass (Mn): 9300 g/mol
    Weight-average molar mass (Mw): 11 100 g/mol
    Dispersity (Mw/Mn): 1.19

The solution of anti-sticking layer is then produced by introducing 3.1 g of polymer in 100 g of propylene glycol methyl ether acetate then recovered after filtration over Entegris filter with 50 nm porosity.

The solids content is then determined by gravimetry and adjusted to 3.0% if necessary, by addition of solvent.

Example 2

In this example, the anti-sticking layers are evaluated for transfer imprinting processes using a fully integrated UV nanoimprint lithography platform (HERCULES from the equipment manufacturer EVG) for silicon wafers up to 200 mm in diameter. This equipment is designed for high throughput manufacture. The nanoimprinting module is based on SmartNIL™ technology.

Two solutions of anti-sticking layers (ASL) are comparatively evaluated, the commercial layer ASL1-EVG and a layer from the novel family of anti-sticking layers for the nanoim print lithography processes of the invention, as prepared in example 1.

The layer ASL1-EVG is coated by centrifugation onto the silicon template 200 mm in diameter, then cleaned with a commercial solvent (pure hydrofluoroether) (HFE). The template is subsequently heated on a hotplate for several minutes at 120° C. The anti-sticking solution ASL from ARKEMA is deposited by centrifugation. The silicon template is then annealed at 200° C. for 75 seconds in order to ensure the chemical grafting of a uniform thin layer. The ungrafted chains are subsequently eliminated by rinsing with solvent (e.g. propylene glycol monomethyl ether acetate).

Characterizations of surface energy are generally used to evaluate anti-sticking layers since the interfacial tension with liquids may be useful for predicting the adhesion work of this layer. The contact angle was measured, using the image of an immobile drop deposited beforehand, at the points of intersection (three-phase points of contact) between the contour of the drop and the surface (base line). Progressive contact angles of water ($H_2O$), diiodomethane ($CH_2I_2$) and ethylene glycol ($C_2H_6O_2$) were measured. The surface energies were calculated from the measured contact angles using the OWRK method. The results are given in table 1. The lowest surface energy (13 mN/m) was obtained with the template treated with the standard process (ASL1-EVG), while a considerably higher surface energy (44 mN/m) is obtained for the anti-sticking layer of the invention (ASL2-invention). A low surface energy is generally preferred for anti-sticking treatment, since the adhesion work is generally correlated to this value. However, the characteristics of the material making it possible to generate the imprint are not taken into account by this characterization. Indeed, adhesion involves physicochemical phenomena when two surfaces are brought into contact. The causes of adhesion are not entirely understood since they depend on numerous correlated factors (electrostatics, mechanical anchoring, acid-base interactions, interdiffusion, creation of covalent bonds, wettability, etc.).

Consequently, an additional characterization was carried out to evaluate the ASL, taking into account the imprint material. The imprint material used to evaluate the ASLs is an acrylic-based material developed by EVG (reference: EVG-AS1). This material, which is UV-curable, is able to reproduce the nanostructures of a template with a very high resolution, while retaining sufficient flexibility for it to be slightly deformed during the imprinting without damaging the nanostructures. The approach used to characterize the adhesion is based on the "double cantilever beam" (DCB) method commonly used for silicon wafer adhesive bonding technology.

The results of the measurements of adhesion energy are given in table 1. An adhesion energy (G) of greater than 600 mJ/cm² is estimated for ASL1-EVG, while a low adhesion energy (G<200 mJ/cm²) is determined for ASL2-invention. These results shed new light on the common conception that consists in associating low surface energy with low adhesion work. In addition, the imprint material is firstly distributed in the liquid state over the surface treated by the anti-sticking layers. Consequently, the ability of the imprint material to entirely wet the main surface is directly linked to the surface energy thereof. Thus, a higher surface energy as obtained with the anti-sticking layer of the invention is preferable to promote the flow of the imprint materials into the template.

Figure 5:
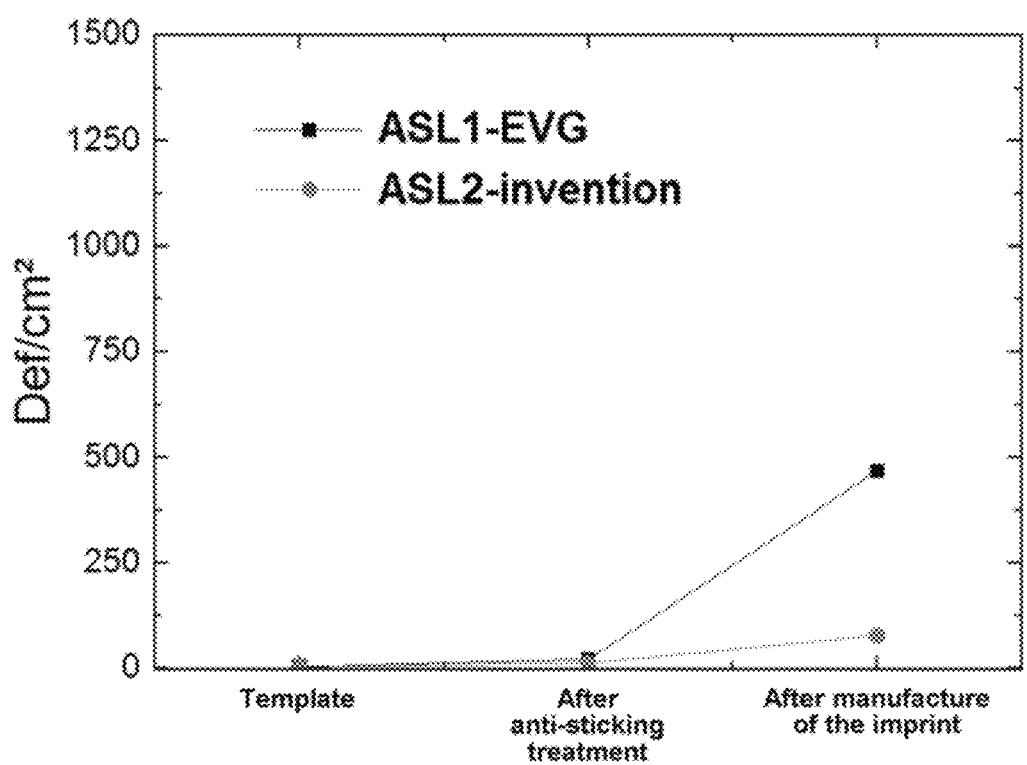

In order to complete the comparative evaluation of the performance of the anti-sticking layers, imprints were produced using dedicated 200 mm wafers treated respectively with the anti-sticking layer ASL1-EVG and the anti-sticking layer of the invention ASL2-invention. The design of the template consists of a network of 400×400 μm lines (directed vertically and horizontally relative to the imprinting direction), of contacts and of pillars of a density ranging from 0.1 to 0.3. The critical dimensions are distributed between 250 nm and several micrometers for each type of network, over a depth of 500 nm. The matrices are distributed over a matrix of 10×10 mm². The matrix is repeated 240 times over the template 200 mm in diameter. The performance of the ASL was evaluated via a defectivity measurement carried out on a dedicated apparatus from Applied Materials (COMPLUS 4T—Darkfield Wafer inspection system). The inspection is carried out by a dark-field illumination method. The formula was optimized in order to reduce the noise contribution and to optimize the signal of the defects. A sensitivity of 100 nm was achieved on the optimized formula. Systematic defectivity inspection measurements were carried out on the two templates throughout the process of manufacturing the imprint. The results are given in FIG. 5. We observed that the surface defectivity was not significantly affected by the step of anti-sticking treatment of the template for both anti-sticking treatments. However, we observed that the defectivity after manufacture of the imprint is much lower (~10 times lower) by virtue of the anti-sticking layer of the invention (ASL2-invention) compared to the standard process (ASL1-EVG).

TABLE 1

|  | ASL1 EVG | ASL2-invention |
|---|---|---|
| Surface energy | 13 mN/m | 44 mN/m |
| Adhesion energy | 743 mJ/m² | 155 mJ/m² |

The invention claimed is:

1. A transfer imprinting process comprising the following steps:
    deposition of an anti-sticking layer on a template, optionally first treated by an adhesion primer (surface activation plasma), the anti-sticking layer comprising a homopolymer or a copolymer having at least one covalent bond that generates free radicals when the homopolyer or copolymer is activated thermally, by organic or inorganic redox, photochemically, by shearing, by plasma, or under the influence of ionizing radiation, the homopolymer or copolymer having a surface energy of greater than 5 mN/m, an elastic modulus E' of greater than 1000 MPa at 25° C. or at the usage temperature as measured by dynamic mechanical analysis, and a weight-average molecular weight of greater than 500 g/mol,
    activation of the covalent bond that generates free radicals thermally, by organic or inorganic redox, photochemically, by shearing, by plasma, or under the influence of ionizing radiation to form a film with a thickness of less than 50 nm on the template,
    deposition or lamination of a polymer resin with a thickness ranging from 100 nm to 5 mm,
    polymerization or cooling of the resin serving as imprint,
    removing the imprint.

2. The process as claimed in claim 1, wherein the covalent bonds that generate free radicals have a bonding energy of between 90 and 270 kJ/mol.

3. The process as claimed in claim 2, wherein the homopolymer or the copolymer is prepared by controlled radical polymerization.

4. The process as claimed in claim 3, wherein the homopolymer the copolymer is prepared by nitroxide-mediated radical polymerization.

5. The process as claimed in claim 4, wherein the nitroxides correspond to the following formula:

(1)

in which the radical $R_L$ has a molar mass of greater than 15.0342.

6. The process as claimed in claim 5, wherein the nitroxide is N-(tert-butyl)-1-diethylphosphono-2,2-dimethylpropyl nitroxide.

7. The use of the process as claimed in claim 1 in macroimprinting, microimprinting, nanoimprinting or stamping for lithography, microelectronics, photonics, optoelectronic applications, MEMS, NEMS, memories, microfluidics, biotechnology, biomedicine, self-cleaning surfaces, anti-reflective surfaces, displays (screens), transfer imprinting for replicating supports, audio or video, or objects for technical applications in leisure, sport, cars or aeronautics.

* * * * *